US008913459B2

(12) United States Patent
Kondo

(10) Patent No.: US 8,913,459 B2
(45) Date of Patent: Dec. 16, 2014

(54) SEMICONDUCTOR DEVICE INCLUDING PLURAL CHIPS STACKED TO EACH OTHER

(71) Applicant: Elpida Memory, Inc., Tokyo (JP)

(72) Inventor: Chikara Kondo, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 0 days.

(21) Appl. No.: 14/200,160

(22) Filed: Mar. 7, 2014

(65) Prior Publication Data

US 2014/0185350 A1    Jul. 3, 2014

Related U.S. Application Data

(63) Continuation of application No. 13/436,592, filed on Mar. 30, 2012, now Pat. No. 8,693,230.

(30) Foreign Application Priority Data

Mar. 31, 2011     (JP) ................................ 2011-080393

(51) Int. Cl.
*G11C 7/22*        (2006.01)
*G11C 8/18*        (2006.01)
*G06F 13/00*      (2006.01)
*G11C 11/4063*   (2006.01)
*G11C 5/06*        (2006.01)
*G11C 5/02*        (2006.01)

(52) U.S. Cl.
CPC .......... *G11C 5/02* (2013.01); *H01L 2224/16145* (2013.01); *G11C 11/4063* (2013.01); *G11C 5/06* (2013.01)
USPC ................... 365/233.17; 365/194; 365/233.1; 365/233.11

(58) Field of Classification Search
USPC ...................................................... 365/233.17
See application file for complete search history.

(56) References Cited

U.S. PATENT DOCUMENTS

| | | | |
|---|---|---|---|
| 7,123,497 B2 | 10/2006 | Matsui et al. | |
| 7,466,577 B2 | 12/2008 | Sekiguchi et al. | |
| 7,545,663 B2 | 6/2009 | Ikeda et al. | |
| 8,239,812 B2 * | 8/2012 | Nishioka et al. | .............. 716/134 |
| 8,310,855 B2 | 11/2012 | Riho | |
| 8,473,653 B2 | 6/2013 | Kondo et al. | |
| 2006/0233012 A1 | 10/2006 | Sekiguchi et al. | |
| 2007/0005876 A1 | 1/2007 | Ikeda et al. | |
| 2011/0093735 A1 | 4/2011 | Yoko et al. | |
| 2011/0317495 A1 | 12/2011 | Ishikawa | |

FOREIGN PATENT DOCUMENTS

| | | | |
|---|---|---|---|
| JP | 2006-277870 A | 10/2006 | |
| JP | 2006-330974 A | 12/2006 | |

* cited by examiner

*Primary Examiner* — Son Mai
(74) *Attorney, Agent, or Firm* — McGinn IP Law Group, PLLC

(57) ABSTRACT

A method for reading data from a plurality of DRAM devices connected to common command, address, and data busses. A clock signal is provided to the plurality of DRAM devices. A read command and address to the plurality of DRAM devices on the command and address busses in synchronization with the clock signal. A read clock signal is provided to the plurality of DRAM devices to initiate a read operation in one of the plurality of DRAM devices that is selected by the address. The one DRAM device delays the read clock signal by an amount based on a speed of the one of the plurality of DRAM devices to generate. First delayed read clock and second delayed read clock signals are provided. The read data is received on the data bus in synchronization with the second delayed read clock signal.

10 Claims, 13 Drawing Sheets

SEMICONDUCTOR DEVICE INCLUDING PLURAL CHIPS STACKED TO EACH OTHER

CROSS-REFERENCE TO RELATED APPLICATIONS

This application is a Continuation application of U.S. patent application Ser. No. 13/436,592, filed on Mar. 30, 2012, which in turn, claims priority to Japanese Patent Application 2011-080393, filed on Mar. 31, 2011.

BACKGROUND OF THE INVENTION

Field of the Invention

The present invention relates to a semiconductor device, and more particularly to a semiconductor device in which a front-end portion having an interface function and a back-end portion including a memory core are integrated on an individual semiconductor chip.

Memory capacities required for semiconductor memory devices such as a DRAM (Dynamic Random Access Memory) are increasing in recent years. To satisfy this demand, a memory device called multi chip package having a plurality of stacked memory chips has been recently proposed. However, because the memory chips used in the multi chip package are normal memory chips which also operate by themselves independently, each of the memory chips includes a so-called front end unit that establishes interfacing to external devices (a memory controller, for example). Accordingly, an occupancy area that can be allocated to a memory core in each of the memory chips is limited to an area with an occupancy area of the front end unit removed from the entire chip area and it is difficult to greatly increase a memory capacity of one chip (one memory chip).

Additionally, although it is a logic system circuit, a circuit that constitutes the front end unit is manufactured at the same time as a back end unit including the memory core and thus it is difficult to speed up a transistor of the front end unit.

As how to solve such a problem, there has been proposed a technique in which a front-end portion and a back-end portion are integrated on an individual chip, and these chips are stacked to form a single semiconductor memory device (see Japanese Patent Application Laid-Open Nos. 2006-277870 and 2006-330974). According to this technique, in a core chip on which the back-end portion is integrated, a space that can be allocated to the memory core increases, whereby a storage capacity per 1 chip (per 1 core chip) can be increased. On the other hand, the interface chip on which the front-end portion is integrated can be manufactured by a process different from the process for the memory core, whereby a circuit can be formed with a high-speed transistor. Furthermore, plural core chips can be allocated to one interface chip, resulting in that a high-speed semiconductor memory device having extremely large capacity as a whole can be provided.

In the stacked semiconductor device, corresponding terminals provided in the respective core chips are short-circuited with each other. For example, data terminals of all the core chips, through which read data are output, are commonly connected with each other, which enables the read data that are read from the core chips to be commonly supplied to a data bus in an interface chip. Because output timings of the read data differ among the core chips, basically no race of the read data occurs on the data bus in the interface chip.

However, respective operation speeds of the core chips vary due to manufacturing process conditions and thus, for example, times from when a read command is received until when read data are output vary among the core chips. In such cases, race of the read data occurs on the data bus in the interface chip and effective widths (window widths) of the read data are reduced.

SUMMARY

In one embodiment, there is provided a semiconductor device that includes: a plurality of core chips stacked to each other, each of the core chips including a memory cell array, a data terminal, and an output circuit that outputs read data that is read out from the memory cell array to the data terminal; and an interface chip that controls the core chips. The data terminals of the core chips are commonly connected to each other so as to form a data path common to the core chips. The output circuits are activated in response to a first read clock signal supplied from the interface chip. The interface chip receives the read data through the data path.

In another embodiment, there is provided a semiconductor device that includes: a plurality of core chips stacked to each other, each of the core chips including a memory cell array, a penetration electrode, and a FIFO circuit that latches read data that are read out from the memory cell array and sequentially outputs the read data latched therein; and an interface chip that controls the core chips. The penetration electrodes of the core chips are commonly connected to each other so as to form a data path. The FIFO circuit includes a plurality of input circuits having input nodes to which each of the read data read out from the memory cell array is commonly supplied and a plurality of output circuits having input nodes each connected to an associated one of output nodes of the input circuits, the output circuits having output nodes being commonly connected to the penetration electrode. Any one of the output circuits is activated based on a plurality of first read clock signals supplied from the interface chip. The interface chip receives the read data through the data path.

DETAILED DESCRIPTION OF THE EMBODIMENTS

Preferred embodiments of the present invention will be explained below in detail with reference to the accompanying drawings.

Figure 1:
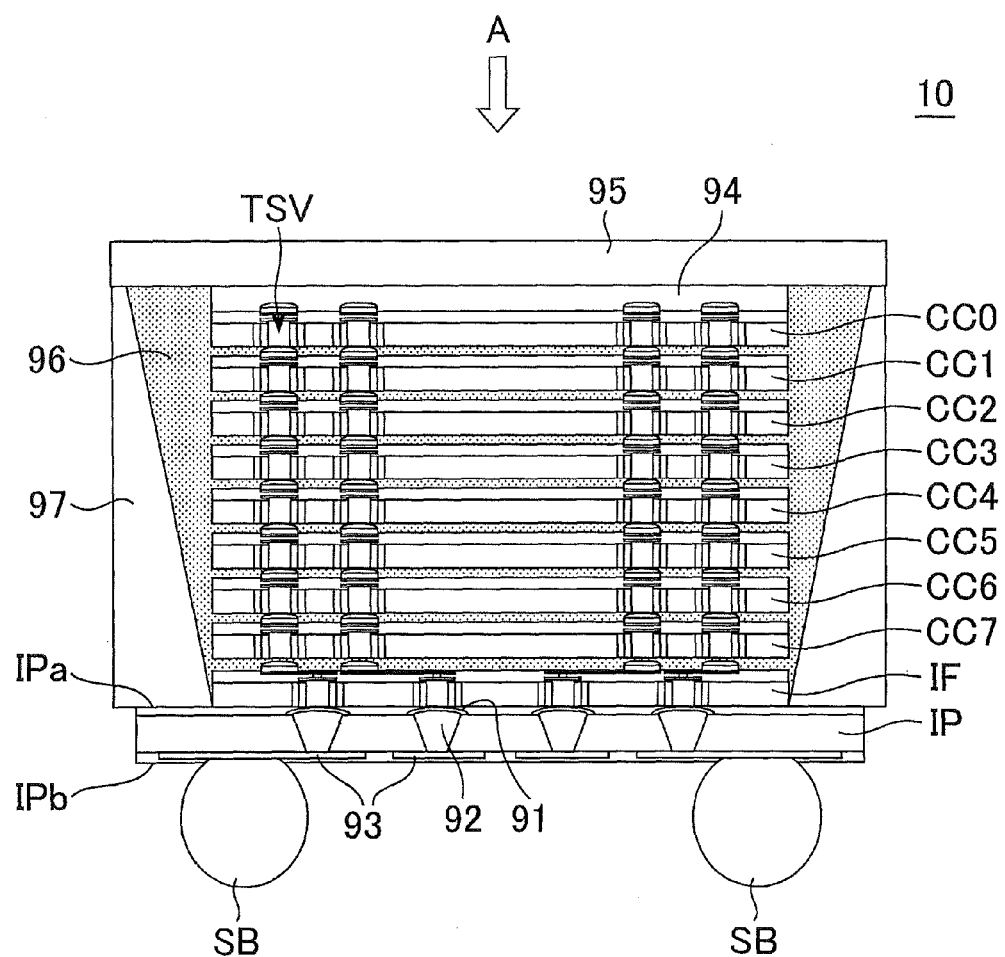
FIG. 1 is a schematic cross-sectional view for explaining a structure of a semiconductor device 10 according to an embodiment of the present invention.

Referring now to FIG. 1, the semiconductor device 10 according to this embodiment has the structure where eight core chips (memory chips) CC0 to CC7 and an interface chip IF are stacked on an interposer IP. The core chips CC0 to CC7 have the same function and structure as one another. It is worth noting that the uppermost core chip CC0 may have a different structure from the other core chips CC1 to CC7. For example, the uppermost core chip CC0 may be thicker than the remaining core chips CC1 to CC7. The core chips CC0 to CC7 are manufactured using the same manufacture mask whereas the interface chip IF is manufactured using a manufacture mask different from that of the core chips CC0 to CC7. The core chips CC0 to CC7 and the interface chip IF are semiconductor chips using a silicon substrate and are electrically connected to adjacent chips in a vertical direction through plural Through Silicon Vias (TSV) penetrating the silicon substrate. The through silicon via may be referred to as a penetration electrode. The uppermost core chip CC0 may not have the through silicon via TSV. Meanwhile, the interposer IP is a circuit board that is made of a resin, and plural external terminals (solder balls) SB are formed in a back surface IPb of the interposer IP.

The core chips CC0 to CC7 are semiconductor chips from which a so-called front-end portion, which performs an interface with an outside, of circuit blocks included in a normal stand-alone SDRAM (Synchronous Dynamic Random Access Memory), is removed. That is, each of the core chips CC0 to CC7 is a memory chip where only the circuit blocks belonging to the back end unit are integrated in principle. As the circuit blocks that are included in the front end unit, a parallel-serial converting circuit that performs parallel/serial conversion on input/output data between a memory cell array and a data input/output terminal and a DLL (Delay Locked Loop) circuit that controls input/output timing of data are exemplified, which will be described in detail below.

On the other hand, the interface chip IF is a semiconductor chip on which only the front-end portion of the circuit blocks included in the normal stand-alone SDRAM is integrated. The interface chip IF functions as a front-end portion common to 8 core chips CC0 to CC7. Accordingly, all of the external accesses are made through the interface chip IF, and data input and data output are made through the interface chip IF.

In this embodiment, the interface chip IF is disposed between the interposer IP and the core chips CC0 to CC7. However, the position of the interface chip IF is not restricted in particular, and the interface chip IF may be disposed on the core chips CC0 to CC7 and may be disposed on the back surface IPb of the interposer IP. When the interface chip IF is disposed on the core chips CC0 to CC7 in a face-down manner or is disposed on the back surface IPb of the interposer IP in a face-up manner, the through silicon via TSV does not need to be provided in the interface chip IF. The interface chip IF may be disposed to be interposed between the two interposers IP.

The interposer IP functions as a rewiring substrate to increase an electrode pitch and secures mechanical strength of the semiconductor device 10. That is, an electrode 91 that is formed on a top surface IPa of the interposer IP is drawn to the back surface IPb via a through hole electrode 92 and the pitch of the external terminals SB is enlarged by the rewiring layer 93 provided on the back surface IPb. In FIG. 1, only the two external terminals SB are shown. In actuality, however, three or more external terminals are provided. The layout of the external terminals SB is the same as that of the SDRAM that is determined by the regulation. Accordingly, the semiconductor memory device can be treated as one SDRAM from the external controller.

As shown in FIG. 1, a top surface of the uppermost core chip CC0 is covered by an NCF (Non-Conductive Film) 94 and a lead frame 95. Gaps between the core chips CC0 to CC7 and the interface chip IF are filled with an underfill 96 and surrounding portions of the gaps are covered by a sealing resin 97. Thereby, the individual chips are physically protected.

Figures 2A, 2B, 2C:
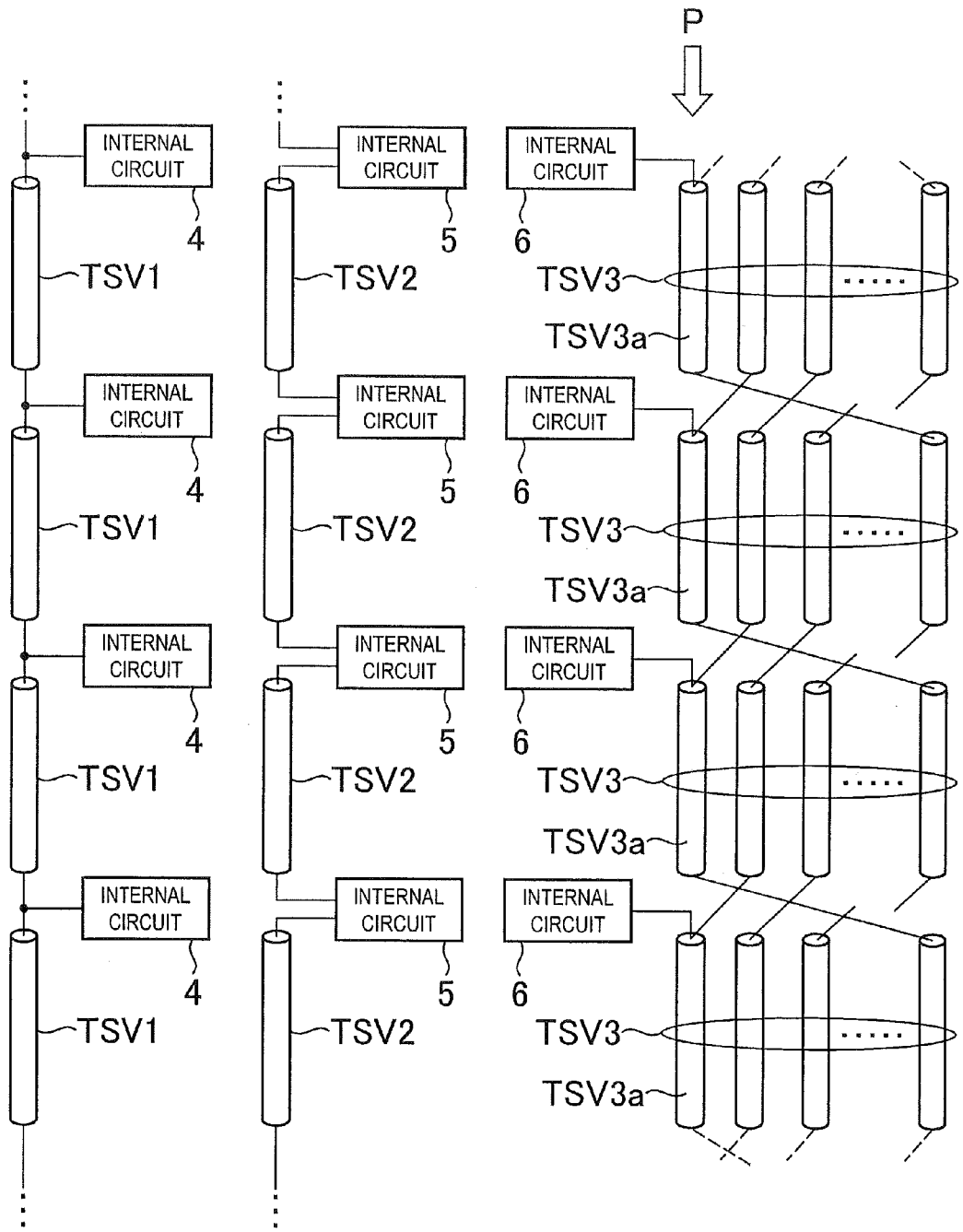
FIGS. 2A to 2C are diagrams indicative of an embodiment of various types of through silicon via TSV provided in a core chip.

When most of the through silicon vias TSV provided in the core chips CC0 to CC7 are two-dimensionally viewed from a lamination direction, that is, viewed from an arrow A shown in FIG. 1, the through silicon vias TSV are short-circuited from the through silicon vias TSV of other layers provided at the same position. That is, as shown in FIG. 2A, the vertically disposed through silicon vias TSV1 that are provided at the same position in plain view are short-circuited, and one wiring line is configured by the through silicon via TSV1. The through silicon via TSV1 that are provided in the core chips CC0 to CC7 are connected to internal circuits 4 in the core chips, respectively. Accordingly, input signals (command signal, address signal, etc.) that are supplied from the interface chip IF to the through silicon vias TSV1 shown in FIG. 2A are commonly input to the internal circuits 4 of the core chips CC0 to CC7. Output signals (data etc.) that are supplied from the core chips CC0 to CC7 to the through silicon via TSV1 are wired-ORed and input to the interface chip IF.

Meanwhile, as shown in FIG. 2B, the apart of the through silicon vias TSV are not directly connected to the through silicon via TSV2 of other layers provided at the same position in plain view but are connected to the through silicon via TSV2 of other layers through the internal circuits 5 provided in the core chips CC0 to CC7. That is, the internal circuits 5 that are provided in the core chips CC0 to CC7 are cascade-connected through the through silicon via TSV2. This kind of through silicon via TSV2 is used to sequentially transmit predetermined information to the internal circuits 5 provided in the core chips CC0 to CC7. As this information, chip address information to be described below is exemplified.

Another part of the through silicon vias TSV is short-circuited from the through silicon vias TSV of other layer provided at the different position in plain view, as shown in FIG. 2C. With respect to this kind of through silicon vias TSV group 3, internal circuits 6 of the core chips CC0 to CC7 are connected to the through silicon via TSV3a provided at the predetermined position P in plain view. Thereby, information can be selectively input to the internal circuits 6 provided in the core chips. As this information, defective chip information to be described below is exemplified.

As such, as types of the through silicon vias TSV provided in the core chips CC0 to CC7, three types (TSV1 to TSV3) shown in FIGS. 2A to 2C exist. As described above, most of the through silicon vias TSV are of a type shown in FIG. 2A, and an address signal and a command signal, and the like are supplied from the interface chip IF to the core chips CC0 to CC7, through the through silicon via TSV1 of the type shown in FIG. 2A. Read data and write data are input to and output from the interface chip IF through the through silicon via TSV1 of the type shown in FIG. 2A. Meanwhile, the through silicon vias TSV2 and TSV3 of the types shown in FIGS. 2B and 2C are used to provide individual information to the core chips CC0 to CC7 having the same structure.

Figure 3:
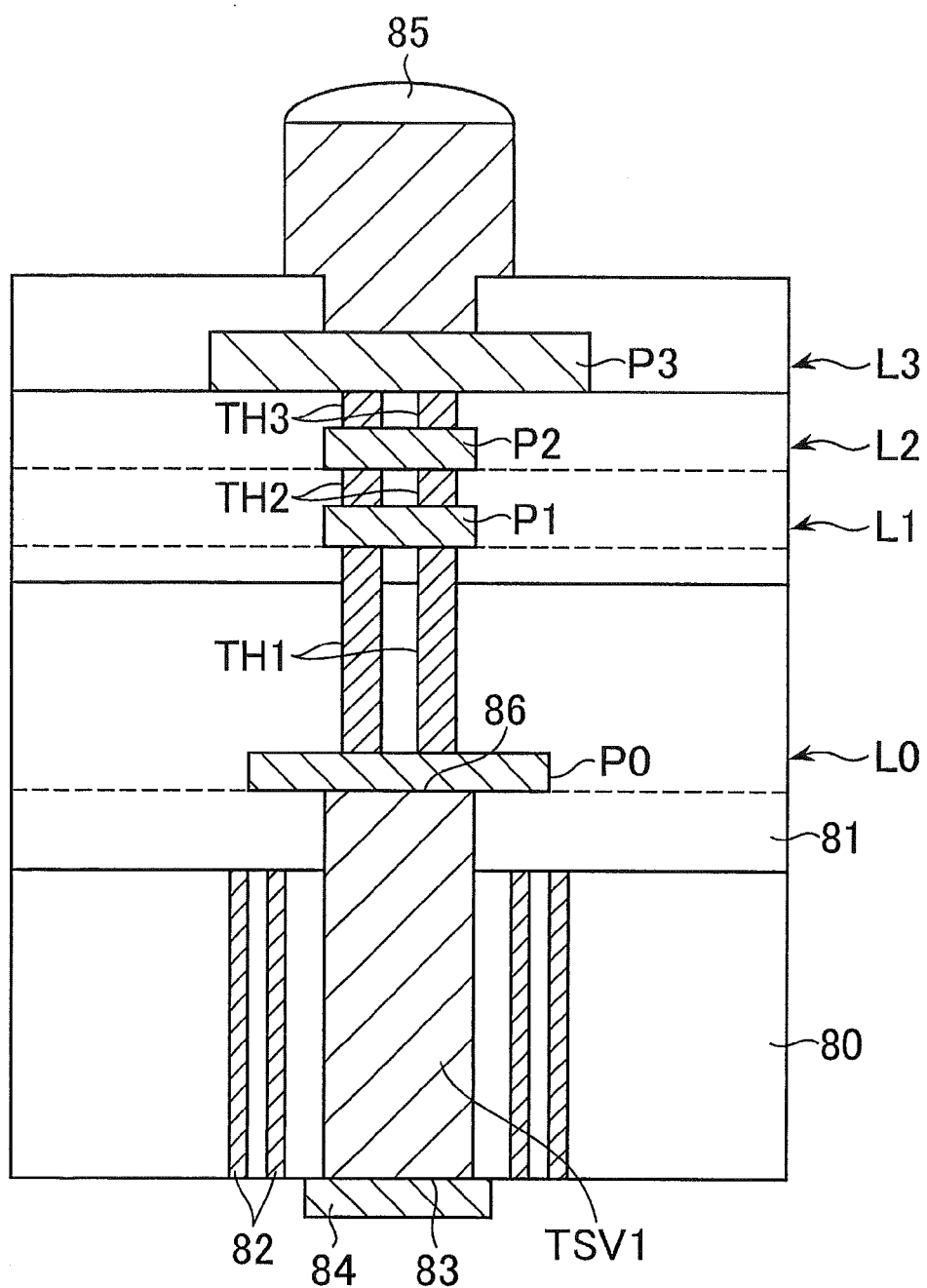
FIG. 3 is a cross-sectional view indicative of an embodiment of a structure of the through silicon via TSV1 of the type shown in FIG. 2A.

Turning to FIG. 3, the through silicon via TSV1 is provided to penetrate a silicon substrate 80 and an interlayer insulating film 81 provided on a surface of the silicon substrate 80. Around the through silicon via TSV1, an insulating ring 82 is provided. Thereby, the through silicon via TSV1 and a transistor region are insulated from each other. In an example shown in FIG. 3, the insulating ring 82 is provided double. Thereby, capacitance between the through silicon via TSV1 and the silicon substrate 80 is reduced.

An end 83 of the through silicon via TSV1 at the back surface of the silicon substrate 80 is covered by a back surface bump 84. The back surface bump 84 is an electrode that contacts a surface bump 85 provided in a core chip of a lower layer. The surface bump 85 is connected to an end 86 of the through silicon via TSV1, through plural pads P0 to P3 provided in wiring layers L0 to L3 and plural through-hole electrodes TH1 to TH3 connecting the pads to each other. Thereby, the surface bump 85 and the back surface bump 84 that are provided at the same position in plain view are short-circuited. Connection with internal circuits (not shown in the drawings) is performed through internal wiring lines (not shown in the drawings) drawn from the pads P0 to P3 provided in the wiring layers L0 to L3.

Figure 4:
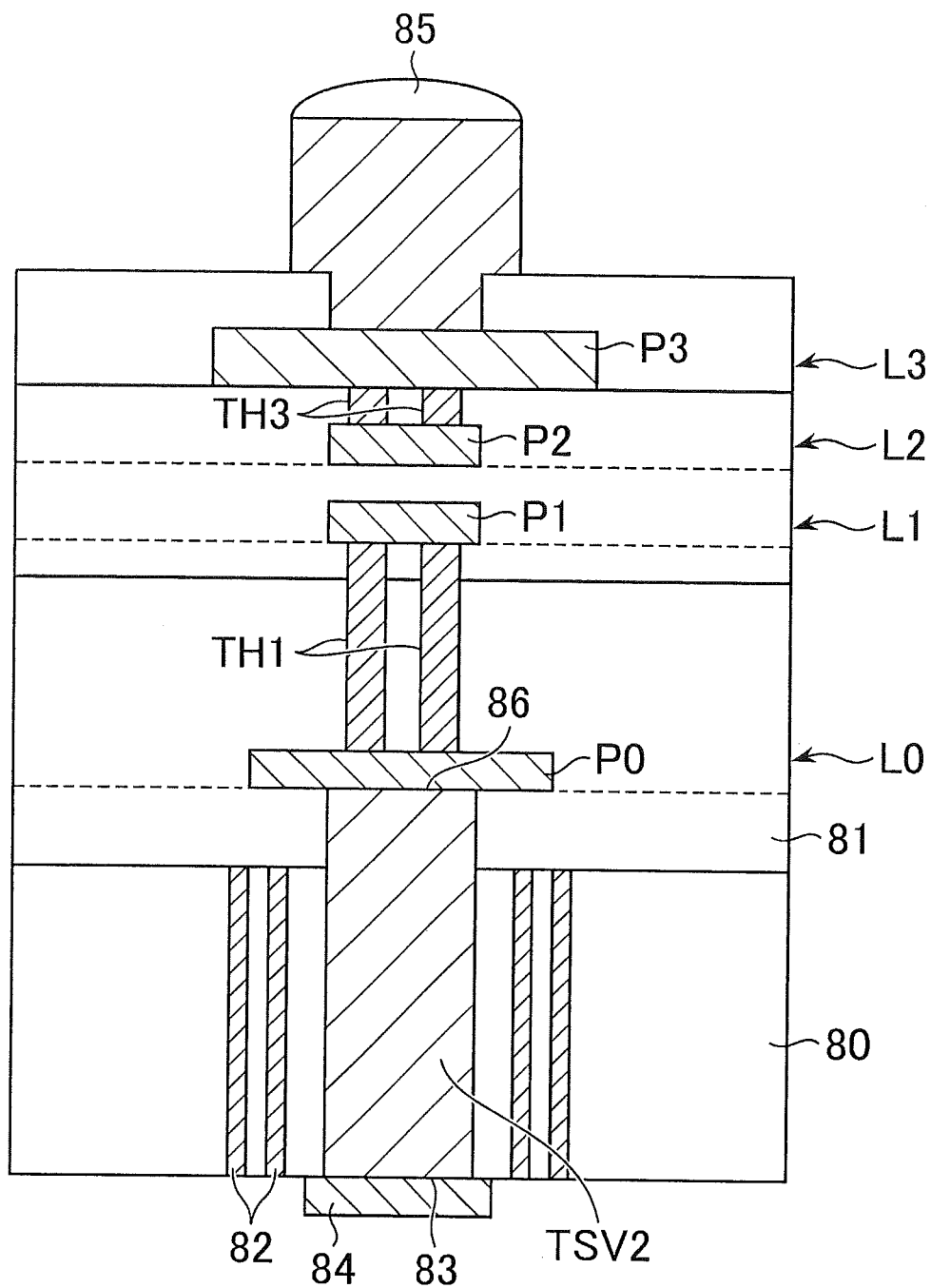
FIG. 4 is a cross-sectional view indicative of an embodiment of a structure of the through silicon via TSV2 of the type shown in FIG. 2B.

Turning to FIG. 4, the through silicon via TSV2 is different from the through silicon via TSV1 shown in FIG. 3 in that the through hole electrodes TH2 that directly connect the pads P1 and P2 located at the same plan position to each other are deleted. The pad P1 is connected to, for example, an output node of the internal circuit 5 shown in FIG. 2, and the pad P2 is connected to, for example, an input node of the internal circuit 5 shown in FIG. 2. This causes the respective internal circuits 5 provided in the core chips CC0 to CC7 to be cascaded through the through silicon vias TSV2.

Figure 5:
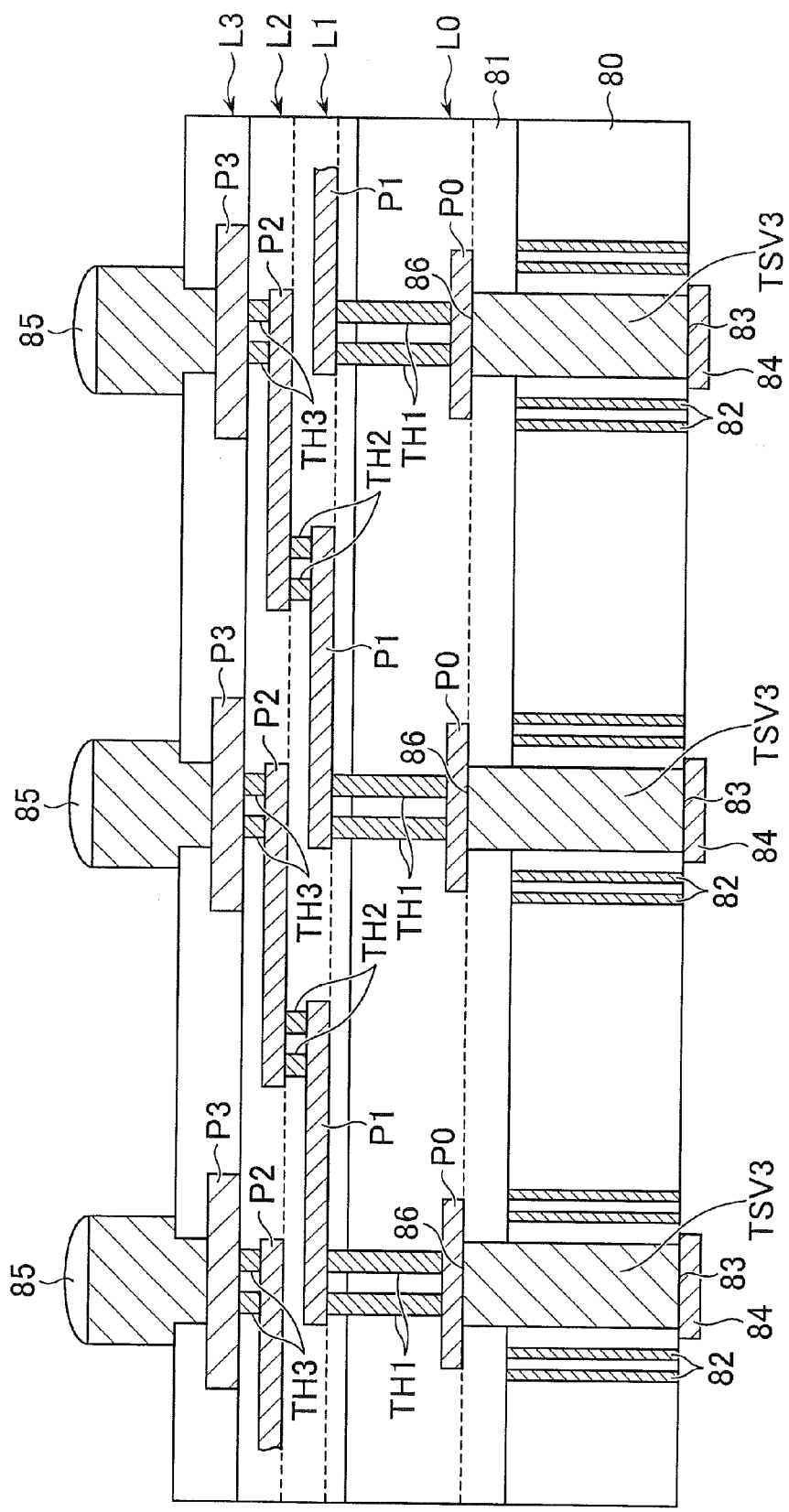
FIG. 5 is a cross-sectional view indicative of an embodiment of a structure of the through silicon via TSV3 of the type shown in FIG. 2C.
Figure 6:
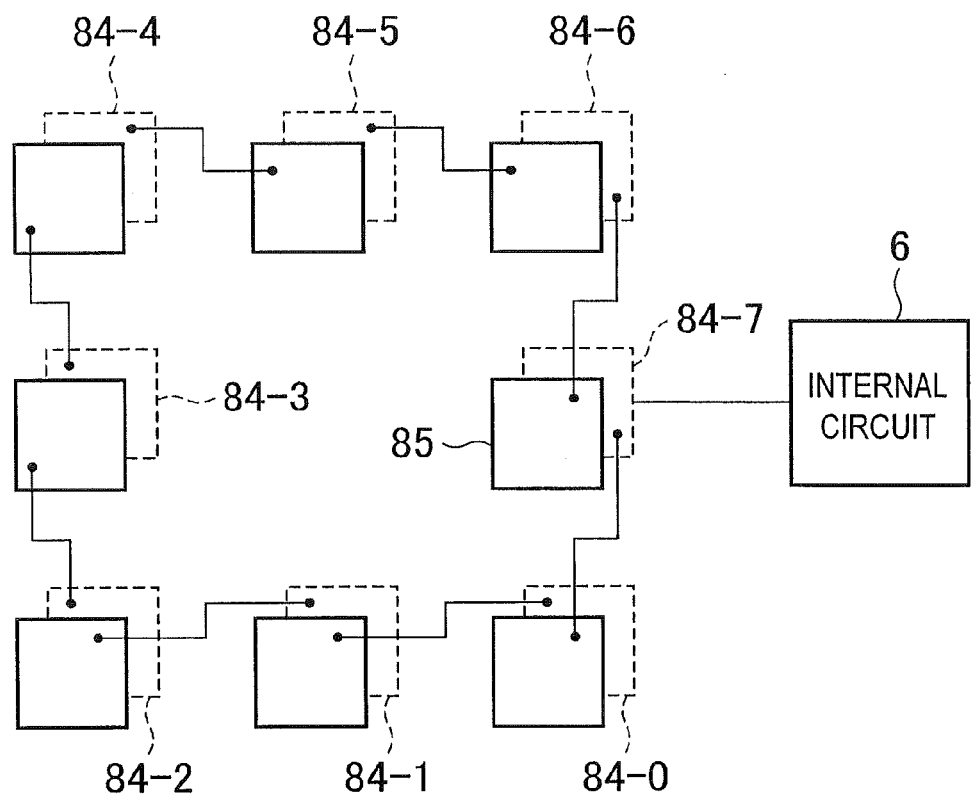
FIG. 6 is a schematic diagram for explaining a connection relation between through silicon vias TSV3 in respective core chips.

Turning to FIG. 5, in the through silicon vias TSV3, not the pads P1 and P2 located at the same plan position but the pads P1 and P2 located at different plan positions are connected by the though hole electrodes TH2. Although only three through silicon vias TSV3 are shown in FIG. 5, the through silicon vias TSV3 are provided in each of the core chips CC0 to CC7 by the number of core chips per signal (that is, eight). The eight through silicon vias TSV3 are connected cyclically as shown in FIG. 6. In FIG. 6, the front bumps 85 are shown by solid lines and the back bumps 84 are shown by broken lines. When the through silicon vias TSV3 are connected cyclically as shown in FIG. 6, different information can be supplied to each of the core chips CC0 to CC7 from the interface chip IF while the core chips CC0 to CC7 have the same circuit configuration. For example, when the internal circuit 6 is connected at the position of the back bump 84-7, signals supplied from the interface chip IF to the back bumps 84-0 to 84-7 of the lowermost core chip CC7 are selectively supplied to the internal circuits 6 of the core chips CC0 to CC7, respectively.

A specific circuit configuration of the semiconductor device 10 is explained next.

Figure 7:
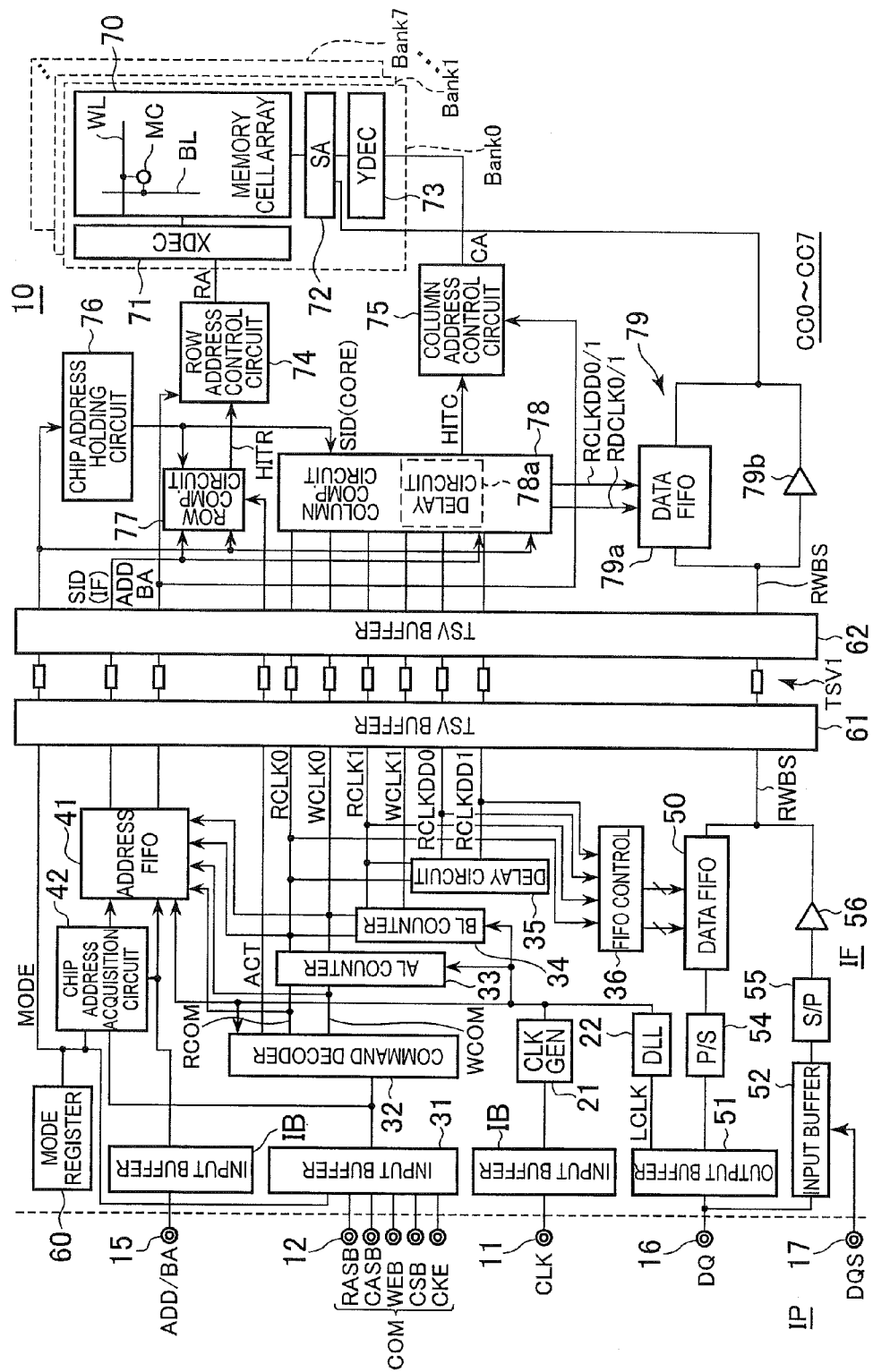
FIG. 7 is a block diagram indicative of an embodiment of a configuration of a semiconductor device according to an embodiment of the present invention.

Turning to FIG. 7, external terminals provided in the interposer IP include a clock terminal 11, a command terminal 12, an address terminal 15, a data input/output terminal 16, and a data strobe terminal 17. Although other terminals such as a calibration terminal and a power supply terminal, and the like are also provided, these terminals are not shown in FIG. 7. Among those, all external terminals other than the power supply terminal are connected to the interface chip IF and are not directly connected to the core chips CC0 to CC7.

The clock terminal 11 is a terminal to which an external clock signal CLK is supplied and the supplied external clock signal CLK is supplied to a clock generation circuit 21 through an input buffer IB. The clock generation circuit 21 is a circuit that generates an internal clock signal ICLK and the generated internal clock signal ICLK is supplied to various circuit blocks in the interface chip IF.

The internal clock signal ICLK is supplied to a DLL circuit 22. The DLL circuit 22 is a circuit that generates an output clock signal LCLK and the generated output clock signal LCLK is supplied to an output buffer circuit 51.

The command terminal 12 is a terminal to which command signals COM including a row address strobe signal RASB, a column address strobe signal CASB, a write enable signal WEB, a chip select signal CSB, a clock enable signal CKE, and the like are supplied. These command signals COM are supplied to a command decoder 32 through an input buffer 31.

The command decoder 32 is a circuit that decodes the command signals COM output from the input buffer 31 to generate various internal commands. The internal commands output from the command decoder 32 include an active command ACT, an internal read signal RCOM, and an internal write signal WCOM. Among these, the active command ACT is supplied to the core chips CC0 to CC7 through a TSV buffer 61 and the through silicon vias TSV1. On the other hand, the internal read signal RCOM and the internal write signal WCOM are supplied to an AL counter 33.

The AL counter 33 is a circuit that receives the internal read signal RCOM and the internal write signal WCOM, delays these signals by an additive latency, and then outputs the delayed signals as a read clock signal RCLK0 and a write clock signal WCLK0, respectively. The additive latency has values that can be changed according to set values in a mode register 60. The read clock signal RCLK0 and the write clock signal WCLK0 are supplied to the core chips CC0 to CC7 through the TSV buffer 61 and the through silicon vias TSV1 and are also supplied to a BL counter 34. There is a case where the additive latency set in the AL counter 33 is zero and, in this case, the read clock signal RCLK0 can be identified with the internal read signal RCOM. Thus, in the present invention, the command decoder 32 and the AL counter 33 are collectively referred to as simply "command decoder" in some cases.

The BL counter 34 is a circuit that receives the read clock signal RCLK0 and the write clock signal WCLK0, delays these signals by a quarter of a burst length, and then outputs the delayed signals as a read clock signal RCLK1 and a write clock signal WCLK1, respectively. The burst length has values that can be also changed according to set values in the mode register 60. The reason why the BL counter 34 is provided is because transfer of read data and write data using the through silicon vias TSV1 is performed in twice in the present embodiment. However, in the present invention, it is not essential to perform the transfer of read data and write data in several batches. As shown in FIG. 7, the read clock signal RCLK1 and the write clock signal WCLK1 are supplied to the core chips CC0 to CC7 through the TSV buffer 61 and the through silicon vias TSV1.

The read clock signals RCLK0 and RCLK1 are also supplied to a delay circuit 35. The delay circuit 35 is a circuit that delays the read clock signals RCLK0 and RCLK1 to generate read clock signals RCLKDD0 and RCLKDD1, respectively. The generated read clock signals RCLKDD0 and RCLKDD1 are supplied to the core chips CC0 to CC7 through the TSV buffer 61 and the through silicon vias TSV1. A delay amount of the delay circuit 35 is set to a time from when the read clock signal RCLK0 is activated until when read data are actually output from a memory cell array. The times may differ among the core chips CC0 to CC7 due to differences in the manufacturing process conditions and, in such a case, the delay amount is matched with the corresponding time in a core chip whose operating speed is the slowest.

The read clock signals RCLK0, RCLK1, RCLKDD0, and RCLKDD1 are also supplied to a FIFO control circuit 36. The FIFO control circuit 36 is a circuit that receives these read clock signals to control a data FIFO 50. Details of the FIFO control circuit 36 and the data FIFO 50 are explained later.

The address terminal 15 is a terminal to which an address signal ADD and a bank address signal BA are supplied, and the supplied address signal ADD and bank address signal BA are supplied to an address FIFO 41 through an input buffer IB.

The address FIFO 41 is a circuit that latches the address signal ADD and the bank address signal BA input synchronously with a column command and delays these signals by the additive latency. The column command indicates a read command and a write command. Latching is performed in timings synchronized with the internal read signal RCOM and the internal write signal WCOM, and outputting is performed in timings synchronized with the read clock signal RCLK0 and the write clock signal WCLK0. The address signal ADD and the bank address signal BA output from the address FIFO 41 are supplied to the core chips CC0 to CC7 through the TSV buffer 61 and the through silicon vias TSV1.

The bank address signal BA is also supplied to a chip address acquisition circuit 42. The chip address acquisition circuit 42 is a circuit that generates a chip address SID based on the bank address signal BA input synchronously with the column command.

Figure 8:
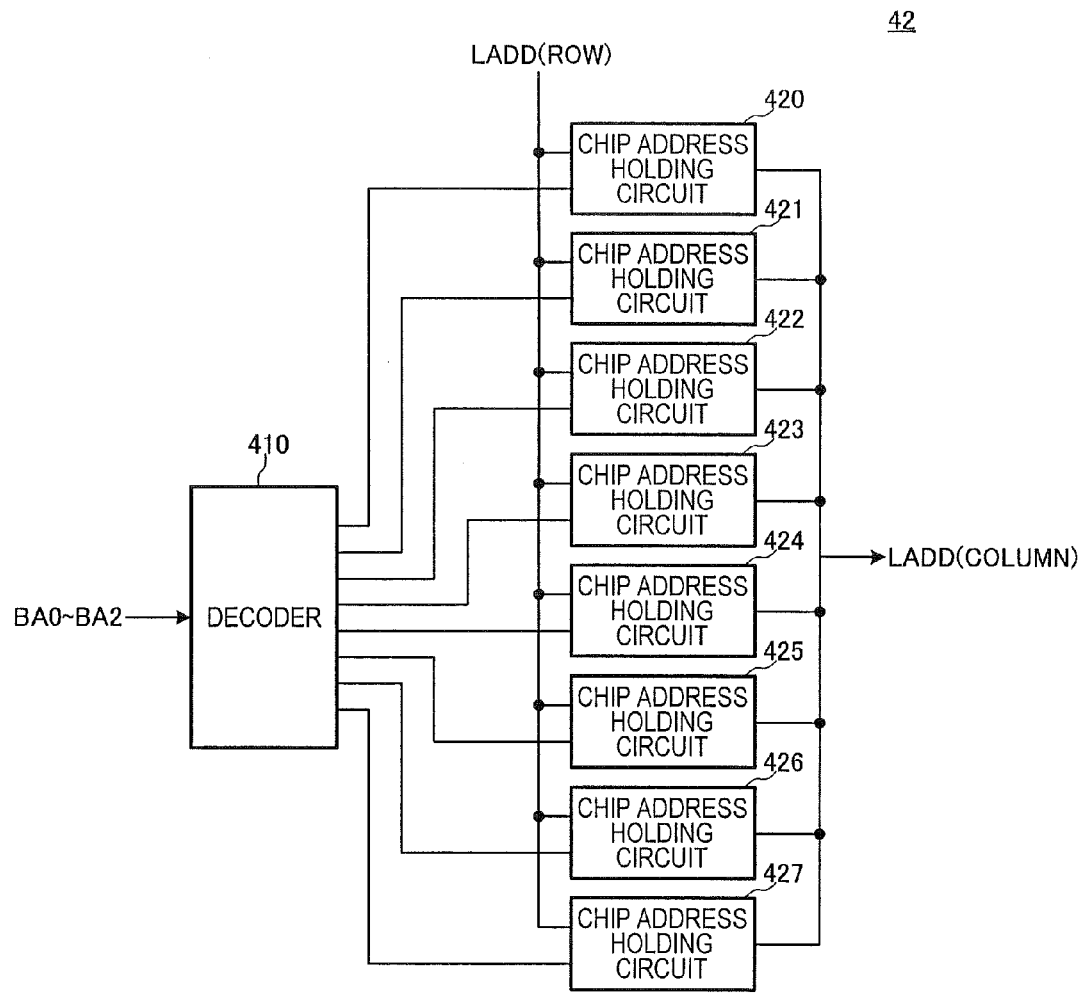
FIG. 8 is a circuit diagram indicative of an embodiment of the chip address acquisition circuit 42.

Turning to FIG. 8, the chip address acquisition circuit 42 includes a decoder 410 that decodes the bank address signal BA, and chip address holding circuits 420 to 427 each of which holds a chip address of each bank. The decoder 410 selects any of the chip address holding circuits 420 to 427 based on a bank address signal BA specified at issuance of an active command ACT. The selected chip address holding circuit holds a chip address SID (ROW) specified at the issuance of the active command ACT. When a chip address is read from a corresponding one of the chip address holding circuits 420 to 427 based on a bank address BA supplied at issuance of a column command, a chip address SID (COLUMN) can be acquired. The chip address SID (COLUMN) is an address indicating one of the core chips CC0 to CC7 to be accessed at the issuance of the column command. The reason why the chip address acquisition circuit 42 is used is because no chip address is input at issuance of a column command.

Turning to FIG. 7, the data input/output terminal 16 is a terminal through which read data DQ or write data DQ is output or input and is connected to the output buffer circuit 51 and an input buffer circuit 52. The output buffer circuit 51 is a circuit that receives read data supplied from a read/write bus RWBS through the data FIFO 50 and a parallel/serial conversion circuit 54 and outputs the received read data to the data input/output terminal 16 synchronously with the output clock signal LCLK. The input buffer circuit 52 is a circuit that receives write data supplied through the data input/output terminal 16 and outputs the received write data to a serial/parallel conversion circuit 55. An operation of the input buffer circuit 52 is performed synchronously with a data strobe signal DQS supplied through the data strobe terminal 17. The parallel/serial conversion circuit 54 is a circuit that converts parallel read data supplied from the core chips CC0 to CC7 through the through silicon vias TSV1 (data terminals of the core chips CC0 to CC7) into serial data and supplies the serial data to the output buffer circuit 51. The serial/parallel conversion circuit 55 is a circuit that converts serial write data supplied from the input buffer circuit 52 into parallel data and supplies the parallel data to a buffer 56.

In this way, parallel data without being converted into serial data are basically input or output between the core chips CC0 to CC7 and the interface chip IF. That is, while input or output of data from or to outside of a chip is performed serially (that is, one data input/output terminal is required for one DQ) in a normal SDRAM that operates alone, input or output of data between the core chips CC0 to CC7 and the interface chip IF is performed parallelly. This point is a significant difference between the normal SDRAM and the core chips CC0 to CC7. However, in the present embodiment, prefetched parallel data are not input or output using through silicon vias TSV different from each other and transfer of read data or write data between the interface chip IF and the core chips CC0 to CC7 is performed in twice. That is, partial parallel/serial conversion is performed on the side of the core chips CC0 to CC7 to reduce the number of through silicon vias TSV required for one DQ. However, this is not essential in the present invention.

While the same through silicon vias TSV1 are used for read data and write data in the present embodiment, through silicon vias TSV1 dedicated for read data and through silicon vias TSV1 dedicated for write data can be used. In this case, read data and write data are transferred via different signal paths and thus no conflict between read data and write data occurs among the ranks, which enables an issuance interval of column commands to be reduced more.

The interface chip IF further includes the mode register 60. The mode register 60 is a register in which operation modes of the semiconductor device according to the present embodiment are set. A mode signal MODE output from the mode register 60 is supplied to various circuit blocks and is also supplied to the core chips CC0 to CC7 through the through silicon vias TSV1.

An outline of the interface chip IF is as explained above. A circuit configuration of the core chips CC0 to CC7 is explained next.

As shown in FIG. 7, a memory cell array 70 included in each of the core chips CC0 to CC7 is divided into eight banks Bank0 to Bank7. A bank is a unit capable of individually receiving a command. In other words, each of the banks can operate independently on a non-exclusive basis. In the memory cell array 70, a plurality of word lines WL and a plurality of bit lines BL intersect with each other and a memory cell MC is placed at each intersection (only one word line WL, one bit line BL, and one memory cell MC are shown in FIG. 7). Selection of a word line WL is performed by a row decoder 71. The bit lines BL are connected to corresponding sense amplifiers in a sense circuit 72. Selection of a sense amplifier is performed by a column decoder 73.

The row decoder 71 is supplied with a row address RA through a row address control circuit 74. The row address control circuit 74 is supplied with the address signal ADD and the bank address signal BA through the through silicon via TSV1 and a TSV buffer 62 and also supplied with a hit signal HITR from a row comparison circuit 77.

When the hit signal HITR is activated, the row address control circuit 74 supplies the address signal ADD to the row decoder 71 of a bank selected based on the bank address signal BA. This activates a specified word line in the specified bank. That is, a row access is achieved.

The column decoder 73 is supplied with a column address CA through a column address control circuit 75. The column address control circuit 75 is supplied with the address signal ADD and the bank address signal BA through the through silicon via TSV1 and the TSV buffer 62 and also supplied with a hit signal HITC from a column comparison circuit 78.

When the hit signal HITC is activated, the column address control circuit 75 supplies the address signal ADD to the column decoder 73 of a bank selected based on the bank address signal BA. This connects a specified sense amplifier of the specified bank to a read/write circuit 79. The read/write circuit 79 includes a data FIFO 79a to be used during a read operation and an input buffer 79b to be used during a write operation. Therefore, during the read operation, read data that are read from the memory cell array 70 through the sense circuit 72 are transferred to the interface chip IF through the data FIFO 79a, the TSV buffer 62, and the through silicon via TSV1. During the write operation, write data that are transferred from the interface chip IF through the through silicon via TSV1 and the TSV buffer 62 are written in the memory cell array 70 through the input buffer 79b and the sense circuit 72.

The row comparison circuit 77 compares a chip address SID (IF) supplied from the interface chip IF through the through silicon via TSV1 with a unique chip address SID (CORE) allocated to a corresponding one of the core chips CC0 to CC7, and activates the hit signal HITR when both of the chip addresses coincide. Similarly, the column comparison circuit 78 compares a chip address SID (IF) supplied from the interface chip IF through the through silicon via TSV1 with a unique chip address SID (CORE) allocated to a corresponding one of the core chips CC0 to CC7, and activates the hit signal HITC when both of the chip addresses coincide.

The unique chip address SID(CORE) is held in a chip address holding circuit 76. The chip address holding circuits 76 are cascaded between the core chips CC0 to CC7 through the through silicon vias TSV2 of the type shown in FIG. 2B, which enables different chip addresses SID to be set in the core chips CC0 to CC7, respectively.

As shown in FIG. 7, the column comparison circuit 78 includes a delay circuit 78a. The delay circuit 78a is a similar circuit to the delay circuit 35 included in the interface chip IF. That is, the delay circuit 78a delays the read clock signals RCLK0 and RCLK1 supplied from the interface chip IF under condition of hit of the chip address to generate read clock signals RDCLK0 and RDCLK1, respectively. The generated read clock signals RDCLK0 and RDCLK1 are supplied to the data FIFO 79a. The read clock signals RCLKDD0 and RCLKDD1 supplied from the interface chip IF to the column comparison circuit 78 are also supplied to the data FIFO 79a under condition of hit of the chip address.

The circuit configuration of the core chips CC0 to CC7 is as described above.

Figure 9:
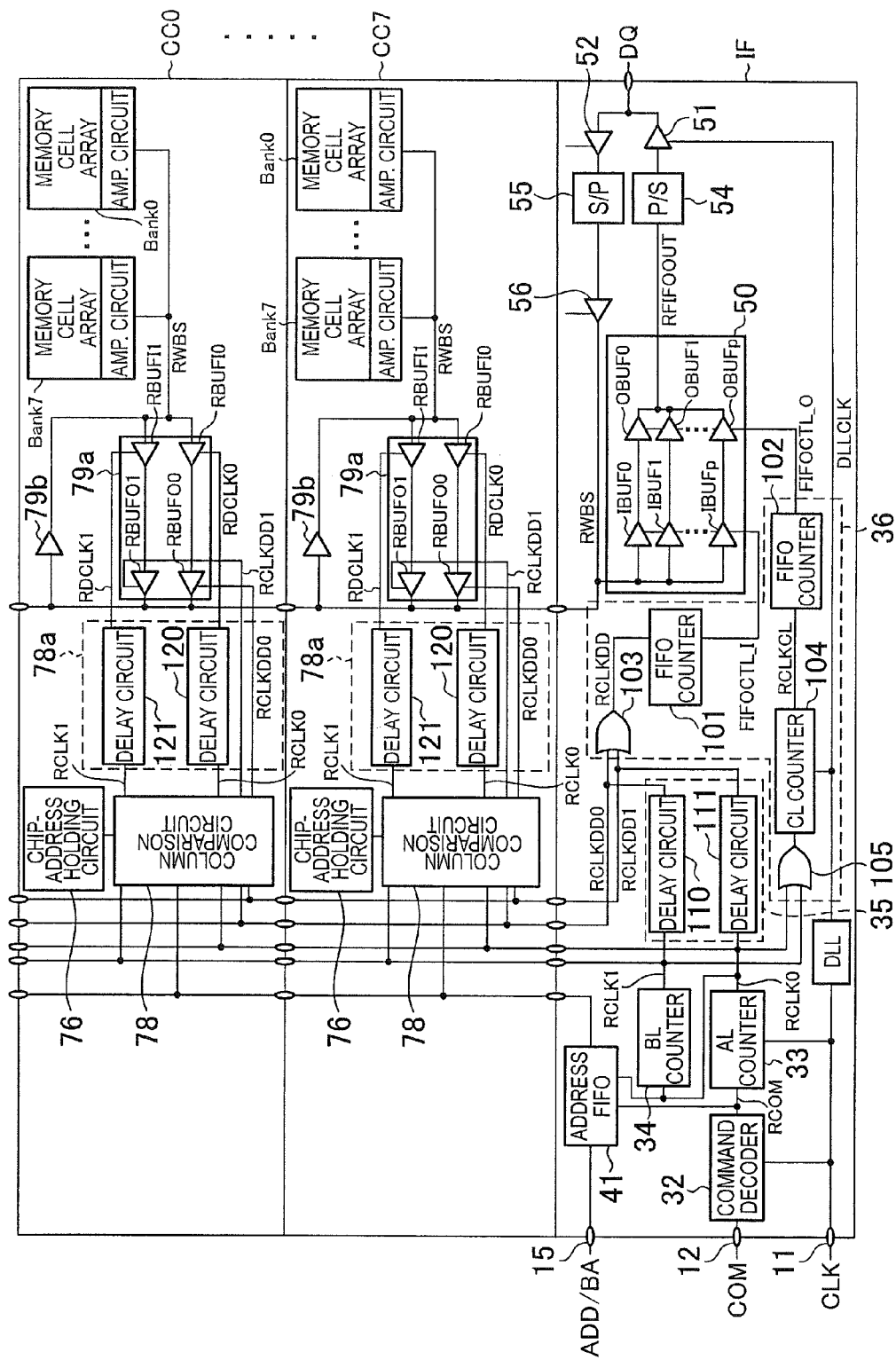
FIG. 9 is a block diagram indicative of an embodiment of parts related to the read operation in more detail among elements constituting the semiconductor device 10 according to the present embodiment.

Turning to FIG. 9, the data FIFO 50 included in the interface chip IF and the data FIFO 79a included in the core chips CC0 to CC7 both include a point-shift FIFO circuit. The point-shift FIFO circuit is a circuit that has a plurality of latch circuits connected in parallel and each including an input circuit and an output circuit, and performs a FIFO operation by activating one of the input circuits and one of the output circuits.

More specifically, the data FIFO 50 included in the interface chip IF includes a plurality of input circuits IBUF0 to IBUFp having input nodes commonly connected to a through silicon via TSV1 for data, and a plurality of output circuits OBUF0 to OBUFp having input nodes connected to output nodes of the input circuits IBUF0 to IBUFp, respectively. Any one of the input circuits IBUF0 to IBUFp is activated based on a count value FIFOCTL_I of a first FIFO counter circuit 101 included in the FIFO control circuit 36. Any one of the output circuits OBUF0 to OBUFp is activated based on a count value FIFOCTL_O of a second FIFO counter circuit 102 included in the FIFO control circuit 36.

The FIFO counter circuit 101 is a circuit that counts up (or counts down) each time a read clock signal RCLKDD output from an OR gate circuit 103 is activated, and cyclically has count values within a range from 0 to p. The read clock signals RCLKDD0 and RCLKDD1 are input to the OR gate circuit 103. Accordingly, the count value FIFOCTL_I of the FIFO counter circuit 101 is updated each time one of the read clock signals RCLKDD0 and RCLKDD1 is activated. The read clock signal RCLKDD0 is generated by a delay circuit 110 included in the delay circuit 35, and the read clock signal RCLKDD1 is generated by a delay circuit 111 included in the delay circuit 35. A delay amount of the delay circuits 110 and 111 is a time from when the read clock signal RCLK0 is activated until when read data are actually output from the memory cell array 70, and is designed to match the corresponding time in one operating the slowest among the core chips CC0 to CC7.

The FIFO counter circuit 102 is a circuit that counts up (or counts down) each time a read clock signal RCLKCL output from a CL counter 104 is activated, and cyclically has count values within a range from 0 to p. The CL counter 104 is a circuit that delays an output signal of an OR gate circuit 105 by a CAS latency. The read clock signal RCLK0 and RCLK1 are input to the OR gate circuit 105. Accordingly, the count value FIFOCTL_O of the FIFO counter circuit 102 is updated each time the CAS latency has elapsed after one of the read clock signals RCLK0 and RCLK1 is activated.

Meanwhile, the data FIFO 79a included in each of the core chips CC0 to CC7 includes two input circuits RBUFI0 and RBUFI1 having input nodes commonly supplied with read data that are read from the memory cell array 70, and two output circuits RBUFO0 and RBUFO1 having input nodes connected to output nodes of the input circuits RBUFI0 and RBUFI1, respectively. Output nodes of the output circuits RBUFO0 and RBUFO1 are commonly connected to the through silicon via TSV1 for data. The input circuits RBUFI0 and RBUFI1 are activated based on the read clock signals RDCLK0 and RDCLK1, respectively, output from the delay circuit 78a. The read clock signal RDCLK0 is generated by a delay circuit 120 included in the delay circuit 78a, and the read clock signal RDCLK1 is generated by a delay circuit 121 included in the delay circuit 78a. The output circuits RBUFO0 and RBUFO1 are activated based on the read clock signals RCLKDD0 and RCLKDD1, respectively, supplied from the column comparison circuit 78.

With this configuration, output timings of read data output from the core chips CC0 to CC7 are synchronized with the read clock signals RCLKDD0 and RCLKDD1 supplied from the interface chip IF.

Figure 10:
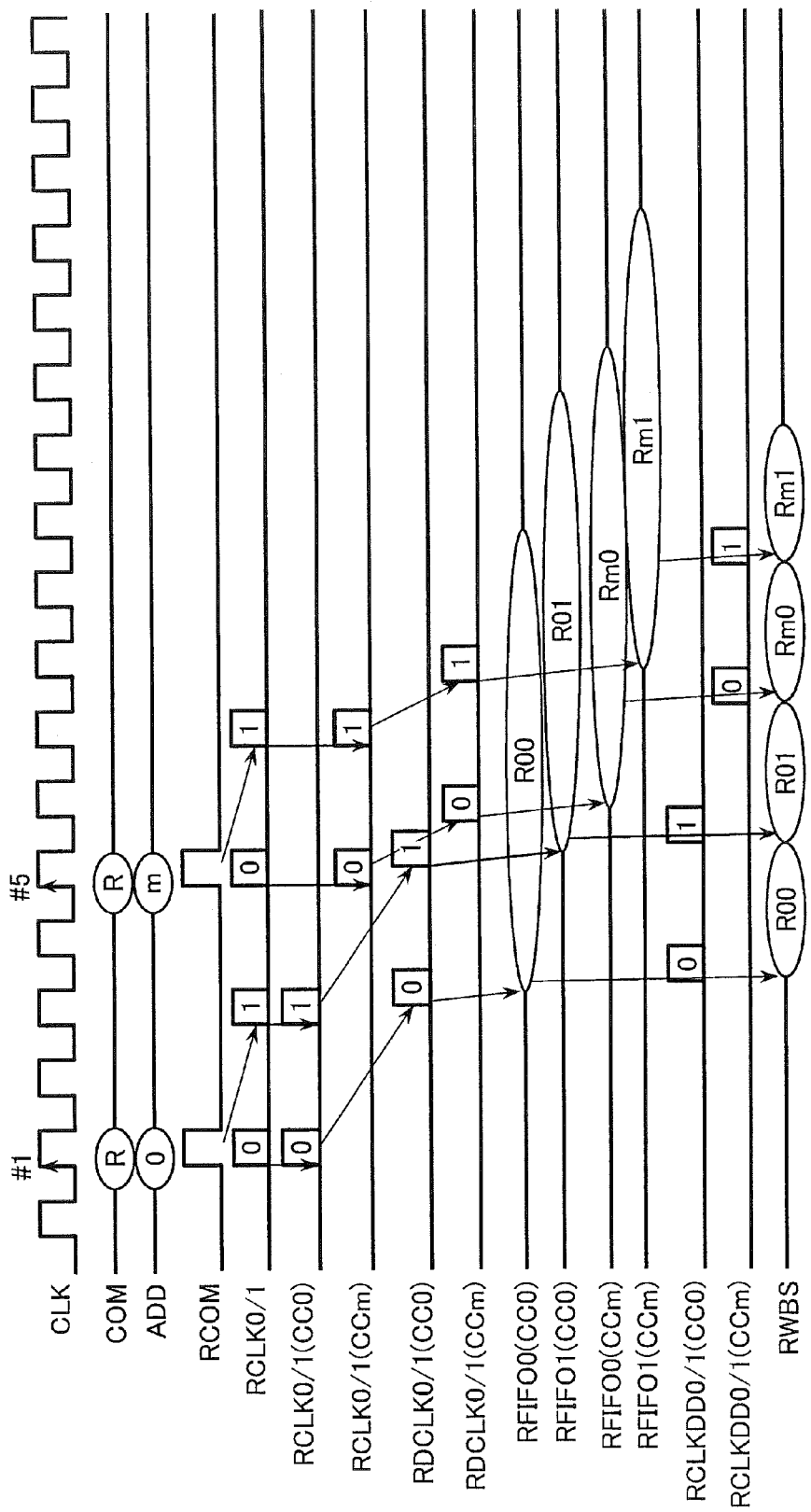
FIG. 10 is a timing chart for explaining a read operation of the semiconductor device 10 according to the present embodiment

In an example shown in FIG. 10, a read command (R) is issued synchronously with active edges #1 and #5 of the external clock CLK. In the present embodiment, a shortest issuance interval (tCCD) between column commands is four clock cycles and thus FIG. 10 shows an example where the read commands are issued at the shortest interval. In the example shown in FIG. 10, AL (additive latency)=0 and BL (burst length)=8. Therefore, the delay in the AL counter 33 is zero and the delay in the BL counter 34 is two clock cycles.

When a first read command (R) is issued synchronously with the active edge #1 of the external clock CLK, the internal read signal RCOM is generated by the command decoder 32. Because AL=0 in this example, the read clock signal RCLK0 is activated almost at the same time as the internal read signal RCOM and then the read clock signal RCLK1 is activated with delay of two clock cycles. While these read clock signals RCLK0 and RCLK1 are commonly supplied to all the core chips CC0 to CC7, an address input synchronously with the first read command specifies the core chip CC0 and therefore the read clock signals RCLK0 and RCLK1 become valid only in the core chip CC0. This control is performed by the column comparison circuit 78 shown in FIG. 7.

Accordingly, a read operation is executed in the core chip CC0 and read data appear on a read/write bus RWBS in the core chip CC0. The read clock signals RCLK0 and RCLK1 are delayed by the delay circuit 78a in the core chip CC0 and output as the read clock signals RDCLK0 and RDCLK1, respectively. Therefore, the read data on the read/write bus RWBS are received by the input circuit RBUFI0 in the data FIFO 79a synchronously with the read clock signal RDCLK0 and received by the input circuit RBUFI1 in the data FIFO 79a synchronously with the read clock signal RDCLK1. As a result, the read data appear on output nodes RFIFO0 and RFIFO1 of the input circuits RBUFI0 and RBUFI1 at respective timings.

The read clock signals RCLK0 and RCLK1 are also delayed by the delay circuit 35 in the interface chip IF and output as the read clock signals RCLKDD0 and RCLKDD1, respectively. While these read clock signals RCLKDD0 and RCLKDD1 are commonly supplied to all the core chips CC0 to CC7, the address input synchronously with the first read command specifies the core chip CC0 as described above and thus the read clock signals RCLKDD0 and RCLKDD1 become valid only in the core chip CC0. This control is performed by the column comparison circuit 78 shown in FIG. 7.

Accordingly, in the core chip CC0, the output circuits RBUFO0 and RBUFO1 in the data FIFO 79a are activated synchronously with the read clock signals RCLKDD0 and RCLKDD1, respectively. As a result, the read data are supplied to the through silicon via TSV1 for data at timings synchronized with the read clock signals RCLKDD0 and RCLKDD1.

When a second read command (R) is issued synchronously with the active edge #5 of the external clock CLK, the same operation as mentioned above is performed. In this example, an address input synchronously with the second read command specifies the core chip CCm and thus the read clock signals RCLK0 and RCLK1 become valid only in the core chip CCm.

The core chip CCm is a chip having a higher operation speed than the core chip CC0 and accordingly a delay amount in the delay circuit 78a is set smaller. Therefore, timings when read data are output from the input circuits RBUFI0 and RBUFI1 in the data FIFO 79a after the read command is issued are earlier than in the core chip CC0. However, in the present embodiment, control of the output circuits RBUFO0 and RBUFO1 in the data FIFO 79a is performed on the side of the interface chip IF and timings when the read clock signals RCLKDD0 and RCLKDD1 are activated are independent of the operation speeds of the core chips CC0 to CC7. Therefore, the timings when the read clock signals RCLKDD0 and RCLKDD1 are activated after the read command is issued are always constant and the read data never conflict on the through silicon via TSV1 and on the read/write bus RWBS in the interface chip IF.

Figure 11:
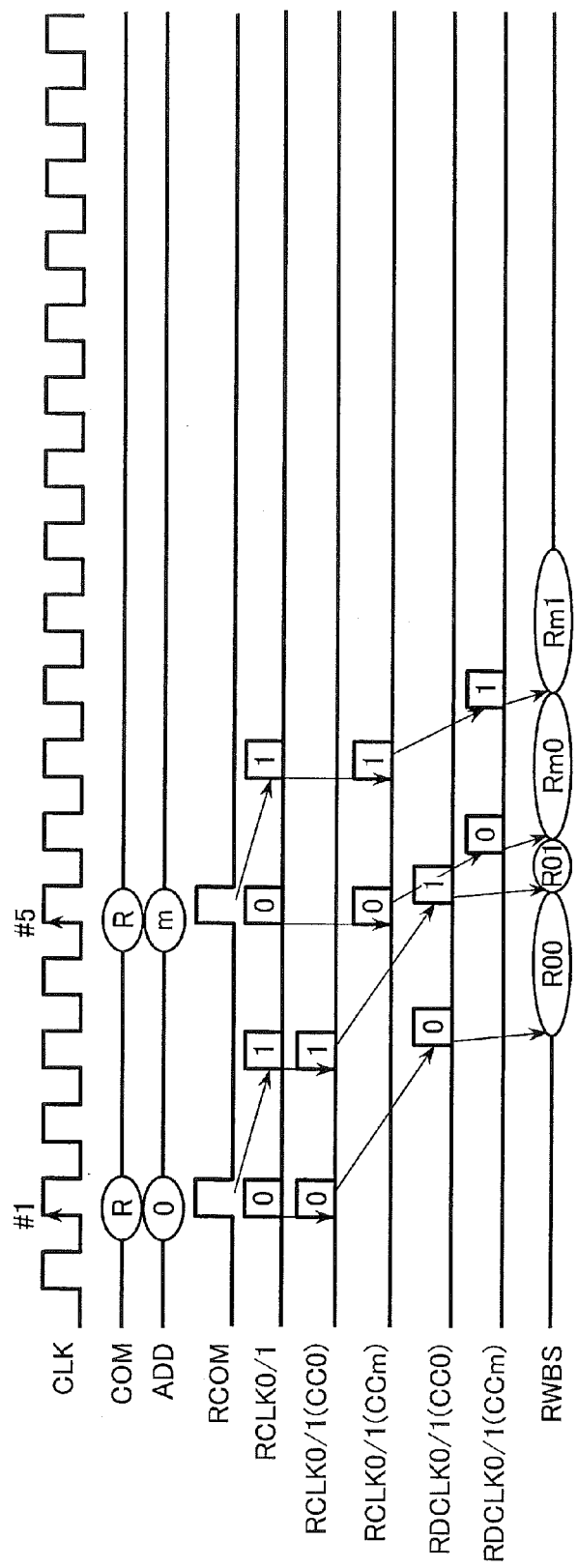
FIG. 11 is a timing chart for explaining a read operation according to a comparative example and shows a case where the read clock signals RCLKDD0 and RCLKDD1 are not used.

Turning to FIG. 11, in the case where the read clock signals RCLKDD0 and RCLKDD1 are not used, timings when read data are output to the through silicon via TSV1 after the read clock signals RCLK0 and RCLK1 are supplied to the core chips CC0 to CC7 differ according to the operation speeds of the core chips CC0 to CC7. In the example shown in FIG. 11, a read command (R) is first issued to the core chip CC0 having a lower operation speed and then a read command (R) is issued at the shortest interval to the core chip CCm having a higher operation speed. In this case, output of read data Rm0 from the core chip CCm is started in the middle of output of read data R01 from the core chip CC0. Accordingly, a latter part of the read data R01 is overwritten with the read data Rm0, which reduces an effective data width. Further, in a case where different read data are output from two core chips, a through current may flow.

On the other hand, such a problem does not occur in the present embodiment and a fixed effective data width can be always secured.

Figure 12:
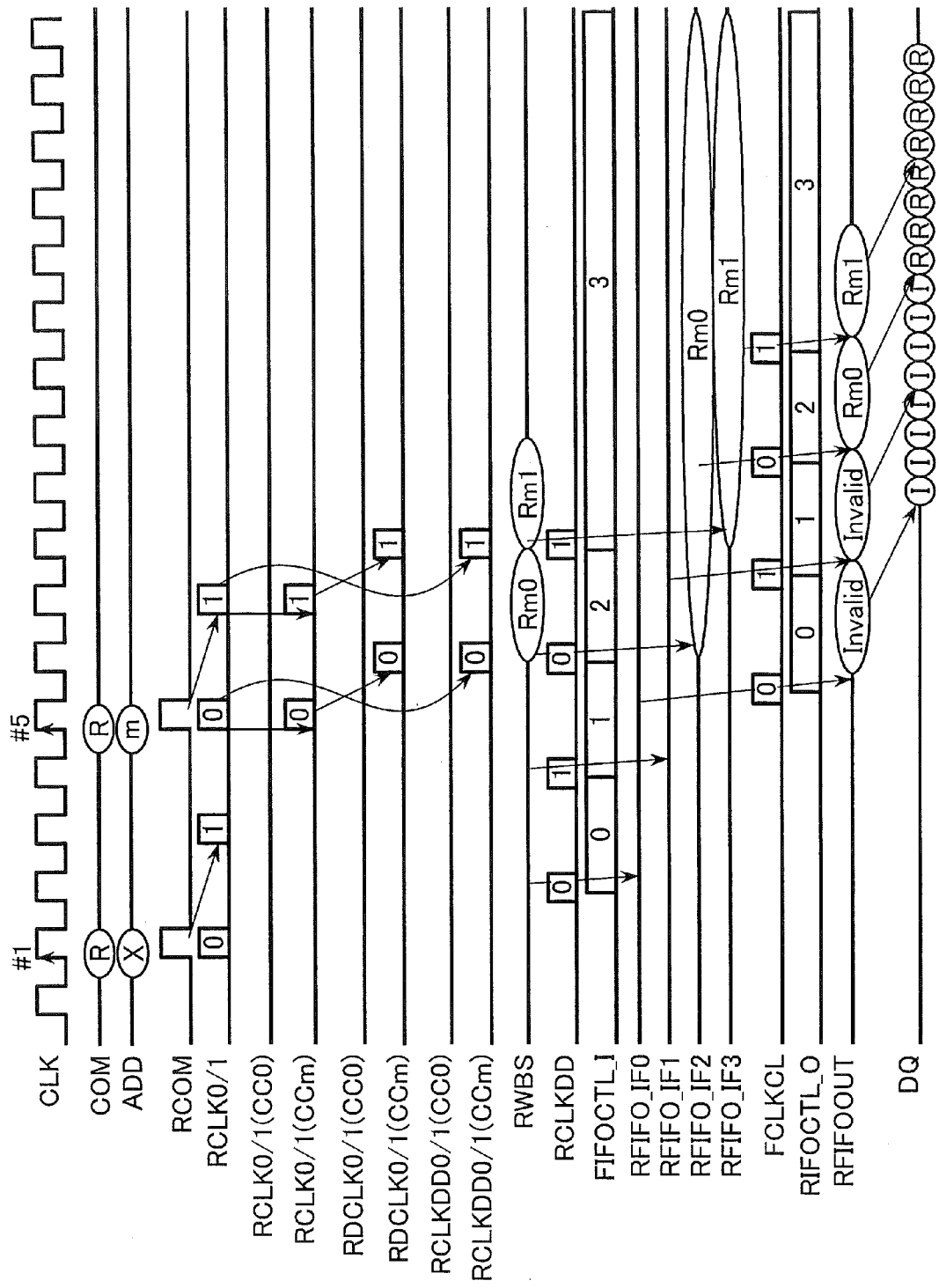
FIG. 12 is a timing chart for explaining an operation performed by the semiconductor device 10 according to the present embodiment in a case where an address input synchronously with a first read command (R) is an invalid address.

Turning to FIG. 12, when the input address is an invalid address, read data do not appear on the read/write bus RWBS in any of the core chips CC0 to CC7. However, it cannot be determined on the side of the interface chip IF whether the input address is an invalid address and thus the FIFO counter circuits 101 and 102 perform the count operation. Accordingly, a difference between the count value of the FIFO counter circuit 101 and the count value of the FIFO counter circuit 102 does not change. This means that the data FIFO 50 operates correctly even when the input address is an invalid address. In FIG. 12, RFIFO_IF0 to RFIFO_IF3 denote read data received by the data FIFO 50 when the count values FIFOCTL_I of the FIFO counter circuit 101 are 0 to 3, respectively. Further, RFIFOOUT denotes read data output from the data FIFO 50.

Figure 13:
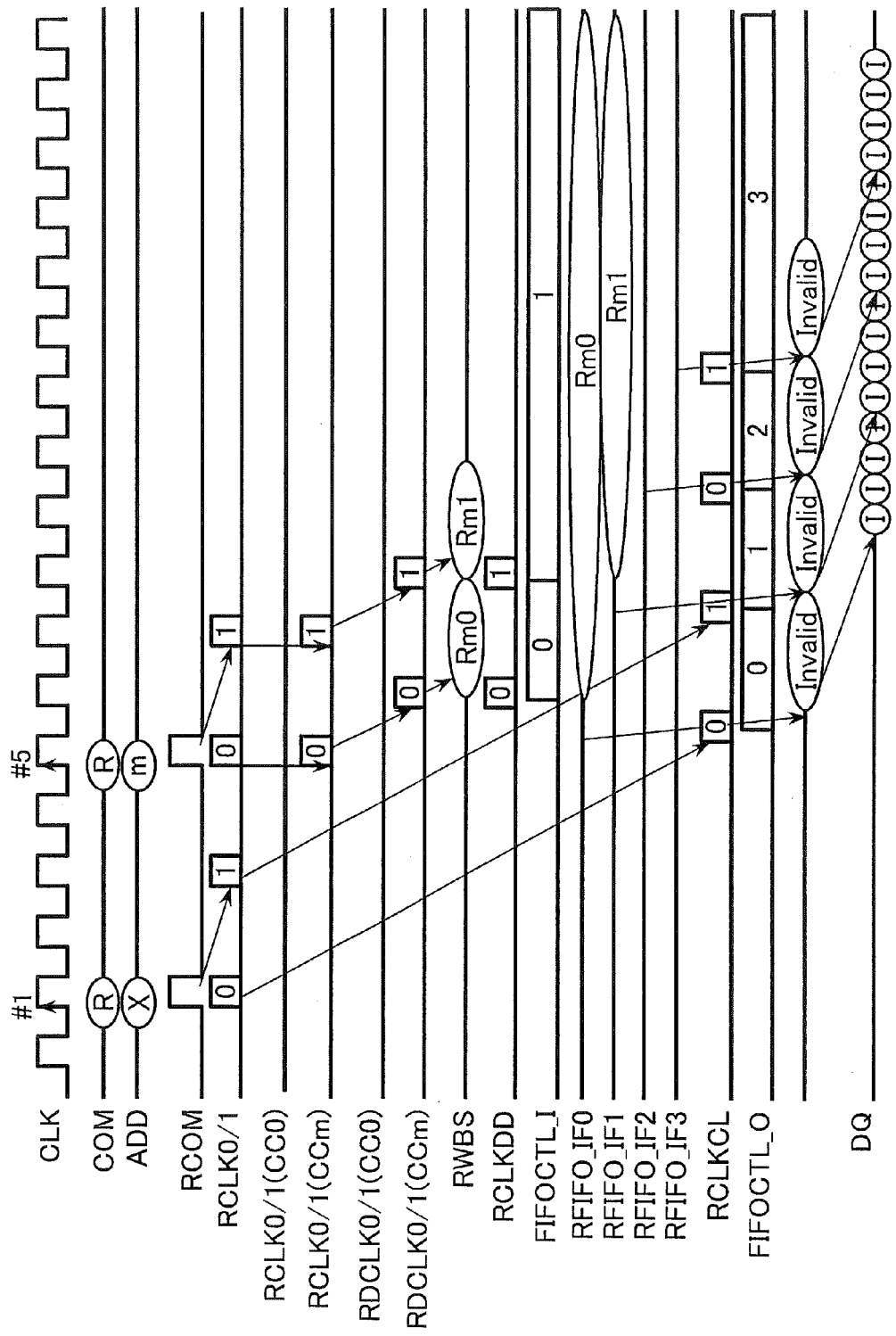
FIG. 13 is a timing chart for explaining an operation performed by a semiconductor device according to a comparative example in a case where an address input synchronously with a first read command (R) is an invalid address.

Turning to FIG. 13, in this example, the count operation of the FIFO counter circuit 101 is performed synchronously with the signals (RCLKDD0 and RCLKDD1) from a selected one of the core chips CC0 to CC7.

As shown in FIG. 13, in the case where the count operation of the FIFO counter circuit 101 is performed synchronously with the signals (RCLKDD0 and RCLKDD1) from the selected one of the core chips CC0 to CC7, the read clock signals RCLKDD0 and RCLKDD1 from the selected one of the core chips CC0 to CC7 are not supplied when the input address is an invalid address. This is because no chip address hits in any of the core chips CC0 to CC7. However, the count operation of the FIFO counter circuit 102 is performed in the interface chip IF and thus a difference between the count value of the FIFO counter circuit 101 and the count value of the FIFO counter circuit 102 changes as shown in FIG. 13. This means that the operation of the data FIFO 50 becomes defective and then cannot be restored if an invalid address is input even once.

On the other hand, such a problem does not occur in the semiconductor device 10 according to the present embodiment, and it is possible to perform a correct operation even when an invalid address is input.

It is apparent that the present invention is not limited to the above embodiments, but may be modified and changed without departing from the scope and spirit of the invention.

What is claimed is:

1. A method for reading data from a plurality of DRAM devices connected to common command, address, and data busses, the method comprising:
    providing a clock signal to the plurality of DRAM devices;
    providing a read command and address to the plurality of DRAM devices on the command and address busses in synchronization with the clock signal;
    providing a read clock signal to the plurality of DRAM devices to initiate a read operation in one of the plurality of DRAM devices that is selected by the address, wherein the one of the plurality of DRAM devices delays the read clock signal by an amount based on a speed of the one of the plurality of DRAM devices to generate a first delayed read clock signal to activate an input of a FIFO receiving read data;
    delaying the read clock signal by an amount corresponding to a speed of a slowest one of the plurality of DRAM devices to generate a second delayed clock signal;
    providing the second delayed read clock signal to the plurality of DRAM devices to initiate a data output operation in the one of the plurality of DRAM devices, wherein the one of the plurality of DRAM devices activates an output of the FIFO to supply the read data to the data bus; and
    receiving the read data on the data bus in synchronization with the second delayed read clock signal.

2. The method as claimed in claim 1, wherein the read clock signal comprises a single pulse.

3. The method as claimed in claim 2, wherein the clock signal comprises multiple cycles.

4. The method as claimed in claim 1, wherein the clock signal comprises multiple cycles.

5. The method as claimed in claim 1, further comprising:
    providing an additional read clock signal, delayed with respect to the read clock signal, to the plurality of DRAM devices, wherein the one of the plurality of DRAM devices delays the additional read clock signal by the amount that is based on the speed of the one of the plurality of DRAM devices to generate a first additional delayed read clock signal to activate the input of the FIFO;
    delaying the additional read clock signal by the amount that corresponds to the speed of the slowest one of the plurality of DRAM devices to generate a second additional delayed clock signal;
    providing the second additional delayed read clock signal to the plurality of DRAM devices to initiate an additional data output operation in the one of the plurality of DRAM devices, wherein the one of the plurality of DRAM devices activates an output of the FIFO to supply additional read data to the data bus; and
    receiving the additional read data on the data bus in synchronization with the second additional delayed read clock signal.

6. The method as claimed in claim 1, wherein an interface device provides address and control signals to the plurality of DRAM devices.

7. The method as claimed in claim 1, wherein the plurality of DRAM devices are provided in a stacked configuration connected by through silicon vias.

8. The method as claimed in claim 7, wherein an interface device is included in the stacked configuration to provide address and control signals to the plurality of DRAM devices.

9. The method as claimed in claim 8, wherein an interposer with external terminals is provided at a bottom of the stack.

10. The method as claimed in claim 7, wherein an interposer with external terminals is provided at a bottom of the stack.

* * * * *